(12) United States Patent
Theodore et al.

(10) Patent No.: US 6,325,852 B1
(45) Date of Patent: Dec. 4, 2001

(54) DIE FOR SHAPED CRYSTAL GROWTH FROM A MOLTEN BATH

(75) Inventors: Fred Theodore, Grenoble; Jean Delepine, Gieres; Jean-Philippe Nabot, Eyguieres, all of (FR); Vladimir Kurlov, Moscow (RU)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/529,305

(22) PCT Filed: Oct. 9, 1998

(86) PCT No.: PCT/FR98/02171

§ 371 Date: Jun. 8, 2000

§ 102(e) Date: Jun. 8, 2000

(87) PCT Pub. No.: WO99/19545

PCT Pub. Date: Apr. 22, 1999

(30) Foreign Application Priority Data

Oct. 10, 1997 (FR) .................................................. 97 12680

(51) Int. Cl.[7] .................................................. C30B 35/00
(52) U.S. Cl. .......................... 117/209; 117/210; 117/211; 117/212
(58) Field of Search ................................. 117/209, 210, 117/211, 212

(56) References Cited

U.S. PATENT DOCUMENTS

| 4,430,305 | 2/1984 | Kalejs et al. ........................ 422/246 |
| 4,557,793 | * 12/1985 | Foell et al. .......................... 117/210 |
| 5,551,977 | * 9/1996 | Menna ................................. 117/209 |

FOREIGN PATENT DOCUMENTS

| 0653504 | | 5/1995 | (EP) | ............................... C30B/15/34 |
| 2055614 | * | 3/1981 | (GB) | ................................... 117/209 |
| 61-106489 | * | 3/1981 | (JP) | ................................... 117/209 |
| 60108398 | | 6/1985 | (JP) | ............................... C30B/15/34 |

OTHER PUBLICATIONS

J.E. LaBelle Jr., "EFG, The invention and application to sapphpire growth" Journal of Crystal Growth 50, (1980) pp 8–17.

Y.A. Tatarchenko, "Shaped Crystal Growth" Fluid Mehcanics and its Applications vol. 20.

Borodin, V.A. eta al, "Local shaping technique and new growth apparatus for complex sapphire products" Journal of Crystal Growth, vol. 104, 1990, pp 69–76.

* cited by examiner

Primary Examiner—Robert Kunemund
(74) Attorney, Agent, or Firm—Hayes, Soloway, Hennessey, Grossman & Hage, P.C.

(57) ABSTRACT

A die for drawing crystals from a molten bath, has a body bored with at least one longitudinal capillary channel arranged between a lower face of the body. The die is intended to be immersed in the molten bath and an upper face of the body intended to support the liquid coming from the molten bath through the capillary channel. The die upper face has a flat surface onto which the capillary channel emerges, and this flat surface forms an angle θ less than 90° with the longitudinal axis of the capillary channel.

12 Claims, 4 Drawing Sheets

DIE FOR SHAPED CRYSTAL GROWTH FROM A MOLTEN BATH

TECHNICAL FIELD

The subject of this invention is a die for the drawing of crystals from a molten bath, that may be used in particular, in solidification methods referred to as capillary growth methods.

These methods consist of fabricating an item made of a polycrystalline or monocrystalline material by drawing it through a die from a bath of the molten material and crystallizing the molten material coming out of the die on a seed.

The invention is particularly applicable to the production of items with a complex shape, made of various materials, for example, oxides, silicon, aluminum, or other metals, in a mono- or poly-crystalline form.

STATE OF THE PRIOR TECHNOLOGY

Methods of manufacturing items made of a monocrystalline or polycrystalline material by growth from a molten bath have been known for a long time and have been described, for example, in document 1: H. E. La Belle, Jr., Journal of Crystal Growth, 50, 1980, pages 8 to 17, and in document 2: Y. A. Tatarchenko, Shaped Crystal Growth, Kluwer Academic Publishers, 1993, 6, pages 1 to 18.

In document 1, the drawing method referred to as EFG (Edge defined, Film-fed Growth) is especially described, a method wherein a die is used that comprises a capillary channel produced in a material that is wetted by the molten bath.

In document 2, various crystal growth methods are described, and in particular, preforming methods that use dies of suitable shape.

Document 3: EP-A-653 504 describes a method of manufacturing items in a polycrystalline or monocrystalline material by crystal growth from a liquid bath of the molten material. In this method, a die is used through which the molten material that one wishes to crystallize on the seed is drawn, and the die and/or the seed is subjected to at least one translational movement in a plane perpendicular to the direction of drawing. In particular, this allows the production of items of complex shape.

Document 4: U.S. Pat. No. 4,430,305 describes a die with capillary tubes suitable for drawing items made of silicon having the shape of a plate. This die has a particular shape in order to encourage the appearance of the impurity SiC only on one side of the plate being produced.

Recent developments in preforming methods make use of drawing devices which permit the development of particular shapes by the use of vertical drawing, combined with relative horizontal movement of the seed on which solidification is occurring, with respect to the die which is supplying the molten material.

Certain installations are derived from a Czochralski furnace, where a seed and crucible are driven in a rotational movement ω about a vertical axis Z, and a translational movement along this same axis.

FIG. 1 appended shows the simple case of traditional preforming of a bar, where only vertical translation of the seed is used.

In such a method, supply takes place in general from a crucible 1 containing the liquid 2 to be solidified, through a die 3 which comprises at least one internal bore, either a capillary channel 5, wherein the liquid coming from the crucible can circulate, or by capillary rise in the case where the liquid wets the die material, or under the effect of a pressure difference between the surface of the liquid 2 in the crucible and the outlet from the die. At the outlet from the die 3, a liquid meniscus 7 is obtained and the solidification of the liquid is initiated on a monocrystalline seed 9 and is continued by the drawing of this seed and of the formed solid 10, upwards in the direction of the arrow, at speed Vz. The precise shape of the solid obtained depends on the distance between the solidification interface 11 and the outlet from the die 3, but always stays close to the latter. The position of this interface can be adjusted by controlling the supply of heat (calories) to the crucible 1.

For local preforming, there is an extra movement: the rotation of the seed about itself.

In document 3, the method described enables one to draw curved shapes, using traditional preforming (i.e. without rotating the seed), or round items using local preforming (i.e. with rotation of the seed).

FIG. 2 appended shows how to obtain a curved rod 19 of circular cross-section, by using the combined movements of vertical drawing and translation in the horizontal direction, of both the seed 9 and the item undergoing solidification.

In this figure, one can see the die 3 bored with a central channel 5, through which the liquid moves to form a meniscus 7 at the outlet of the die with a solid-liquid interface 11 of the item undergoing solidification 19. In this case, the seed 9 is displaced in the vertical direction at speed Vz causing a horizontal translational movement to be described at the die at a suitable speed Ux. The diameter of the die is matched to provide the desired diameter d of the curved rod 19, this diameter also depending on the position of the interface 11 above the die 3. In order to obtain a rod having the shape of an elliptical arm with half-axes a and b, the horizontal translational movement of the die is carried out between a first position wherein the seed and the die are aligned and a second position wherein the seed is the distance b from the die, and the speed of vertical drawing is regulated and the horizontal translation function Ux of the die in relation to time t, is such that one has:

$$Vz=(\pi a/2\tau)\cdot\sin(\pi t/2\tau) \text{ and } Ux=(\pi b/2\tau)\cdot\cos(\pi t/2\tau)$$

with τ representing the duration of drawing and a and b representing respectively the half-axes of the ellipse.

In the methods described above one uses the same dies as those developed for traditional preforming, that is to say dies whose upper face is horizontal, or perpendicular to the axis of the bore and to the direction of drawing. With such dies, the control of the shape given to the preforming material occurs only at the fluid meniscus 7. Its geometry depends on the capillary constant of the molten material and the contact limit conditions on the die. The shape of the meniscus and its contact on the die are therefore the only parameters which locally define the shape of the crystal.

Whatever the height Hm of the meniscus, linked to the nature of the material and to the thermal profile in the furnace, the equilibrium of the fluid drop on the horizontal die always leads, for large drawing angles, to too small a crystal thickness for the method of pulling away horizontally to be viable.

It has also been observed that the use of dies wherein the upper face is horizontal is also restricted by the problem of attachment of the meniscus over the entire section of this face. The control of the shape then becomes deficient and makes the method of pulling away horizontally non-viable.

In FIG. 3, which represents diagrammatically a preforming method analogous to that in FIG. 2, and which uses the same reference numbers, it can be seen that the thickness Ec of the crystal 19 drawn with the die 3 with a horizontal upper face, depends on the characteristic dimension Ef of the die 3, the height of the meniscus Hm and the drawing angle α. This drawing angle is uniquely a function of the speeds imposed by the growth. For example, in FIG. 2, where the speed of horizontal translation is designated Ux and the speed of vertical drawing is Vz, the drawing angle is given by:

$$\text{tg } \alpha = \frac{Ux}{Vz} \quad (R1)$$

When the height of the meniscus Hm is negligible compared with Ef (this is the case for example for sapphire), the thickness Ec of the crystal is given by:

$$Ec = Ef \cdot \cos \alpha \quad (R2)$$

The equation (R2) reveals a major handicap of preforming using traditional dies: the geometric limitation of the drawing angle required to keep the crystal from having zero thickness. Quite obviously, a drawing angle of 90° to the vertical is impossible with a traditional die with a horizontal top.

Hence, these traditional dies are not suitable for large drawing angles and, in particular to create horizontal pulling away of the crystal growth.

DESCRIPTION OF THE INVENTION

The precise subject of this invention is a die for drawing mono-crystals or poly-crystals from a molten bath, which remedies this disadvantage.

For this purpose, the invention proposes a die for the drawing of mono-crystals or poly-crystals from a molten bath, comprising a body bored with at least one longitudinal capillary channel arranged between a lower face of the body intended to be immersed in the molten bath and an upper face of the body intended to support the liquid coming from the molten bath through the capillary channel wherein said upper face comprises at least one flat surface at which the capillary channel or channels emerge, said flat surface forming an angle θ less than 90°, for example 45°, with the longitudinal axis of the capillary channel or channels.

This die therefore comprises an upper flat surface supporting the liquid undergoing solidification, which is inclined with respect to the horizontal, which enables one to produce, under satisfactory conditions, the horizontal growth necessary for the development of certain shapes, such as, for example, a round ellipsoid or paraboloid, items bent through 90° etc.

According to the invention, this flat surface at which the capillary channel emerges thereby defines a single unique plane in space.

The die of the invention may comprise a single capillary channel, for example of circular, square or rectangular cross section, or in the shape of a circular crown. It may also comprise several capillary channels of circular section or even several capillary channels of circular section emerging below the upper face of the die into a single capillary channel of rectangular cross section, as described in document 4: U.S. Pat. No. 4,430,305.

The edges of the opening of the capillary channel on the flat surface of the upper face of the die can make an angle of 90° with this flat surface, or form an angle less than 90°, for example 45°, with this surface.

According to a preferred embodiment, the die of the invention comprises a single capillary channel and an upper face, only a part of which forms the flat surface making an angle of less than 90° with the longitudinal axis of the capillary channel, the capillary channel emerging onto the flat surface through a section inclined with respect to the longitudinal axis of the channel.

This section generally has a smaller cross section than that of the rest of the capillary channel.

Furthermore, it is preferable that the edges of the opening through which the section emerges onto the flat surface of the upper face of the die form an angle less than 90° with this flat surface.

By way of example, this angle may be 45° like angle θ.

The dies of the invention may be produced in various materials on condition that the material is chemically inert to the molten bath and that it is preferably wetted by the molten bath. They may, in particular, be produced in molybdenum.

Other characteristics and advantages of the invention will better become apparent on reading the description which follows of embodiment examples given, it is understood, as illustrative and non-limitative examples, and which make reference to the appended drawings.

DETAILED DESCRIPTION OF EMBODIMENTS

Figure 1:
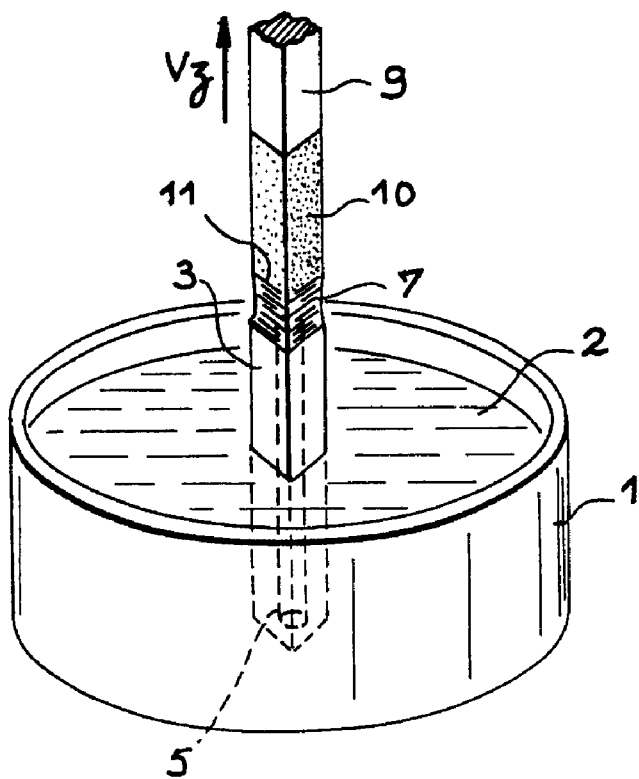
FIG. 1, already described, diagrammatically illustrates the traditional method of drawing of the prior art, wherein, only the seed is moved in a vertical translational movement.
Figure 2:
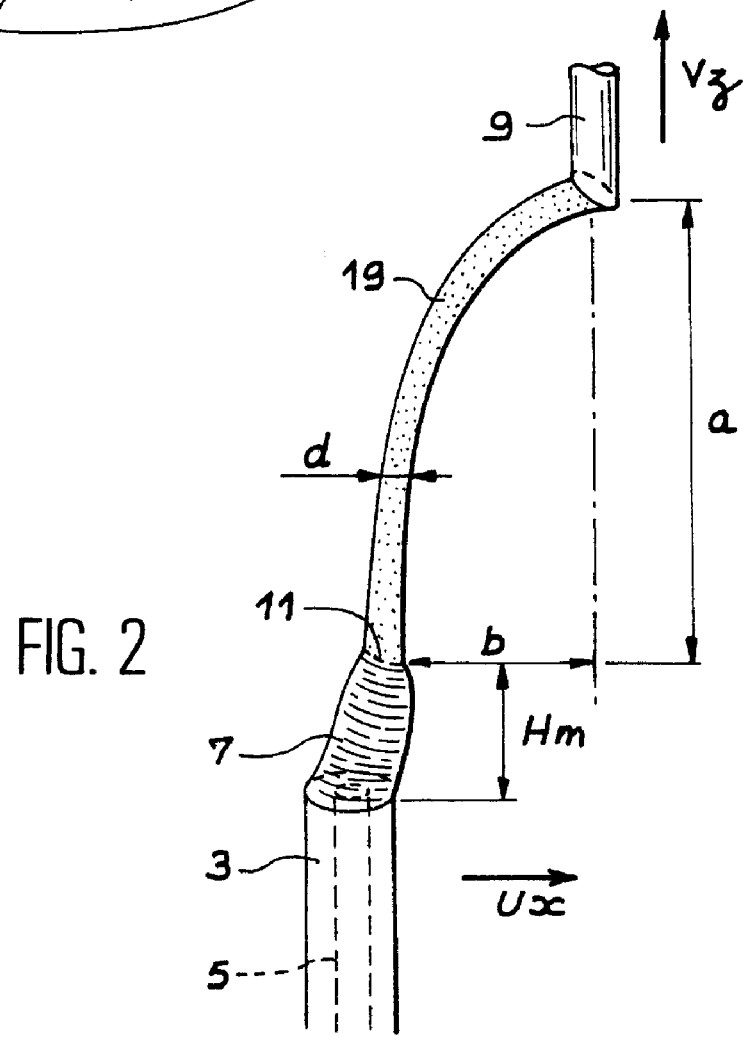
FIGS. 2 and 3, already described, illustrate the traditional preforming method of the prior art using two translational movements.
Figure 3:
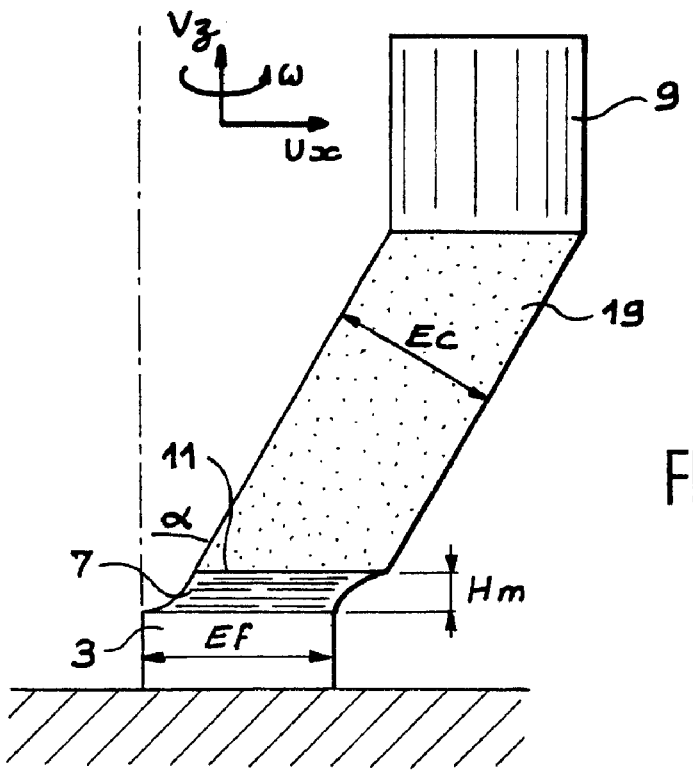
Figure 4:
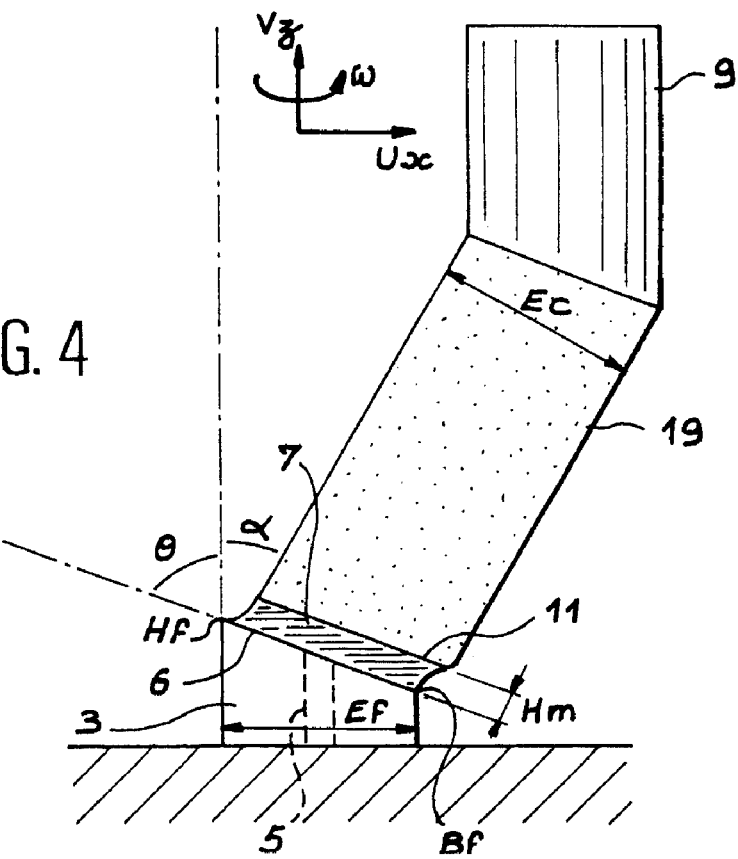
FIG. 4 is a diagrammatic representation of a method of preforming a curved shape conforming to the method described in EP-A-653 504, but using a die conforming to the invention.

Referring to FIG. 4, wherein the same reference numbers have been used as in FIGS. 1 to 3 to refer to the die 3, the seed 9, the crystal 19, the fluid meniscus 7 and the solidification interface 11, it can be seen that, using a die conforming to the invention, the upper face 6 of this die makes an angle θ less than 90° with the longitudinal axis of the capillary channel 5, or with the vertical.

Under these conditions, the characteristic dimension Ec of the crystal produced is always linked to that of the die and to the drawing angle α. The height Hm of the meniscus is also involved, but the shape of the crystal obeys the simple equation (R3) below, whatever the material, when Hm is negligible compared with the dimension Ef of the die.

$$Ec = Ef\left(1 - \frac{\sin \alpha}{\text{tg } \theta}\right) \quad (R3)$$

Simple geometric considerations show that the range of drawing angles α that are theoretically possible, passes from $[-\pi/2; \pi/2]$ with the horizontal die (equation R1) to $[-\theta; \pi/2]$ with the die of the invention (equation R3).

The range of possible values for $\alpha$ is reduced ($\pi$ to $\pi/2+\theta$) but through the inclination angle $\theta$, a translation equivalent to the interval that is theoretically possible is provided, which is of particular interest when the method only counts on values with a constant sign for the horizontal speed. This is commonly done for the production of round items of variable cross section. The inversion of Ux remains possible within the limit where the drawing angle $\alpha$ remains greater than $-\theta$. In this latter case, a die can be used that, on its upper face, comprises two flat surfaces that respectively make angles of $+\theta$ and $-\theta$ with the axis of the capillary channel. In this case, each flat surface has an opening at which the capillary channel emerges. Two capillary channels may also be used, each associated with a single opening. Such a die permits a range of drawing angles that is completely symmetrical.

With the die of the invention, there is a temperature difference in the crystallization zone. In effect, the height difference between the high Hf and low Bf points of the flat surface 6 of the die leads to a temperature difference between these same points in the axially symmetric hot zone of the furnace. Bf is at a higher temperature than Hf. Against all expectations, this thermal gradient improves growth which facilitates the attachment of the meniscus 7 at Hf. and guarantees excellent control of the shape at this point. Furthermore, various solutions such as thermal screening and the die support geometry, enables one to resolve the problem of overheating at Bf and to provide control of the method at this point that is just as good as at Hf.

Hence, the die of the invention finally resolves the problem of the horizontal growth that is necessary to create certain shapes such as a round ellipsoid or paraboloid and items with a 90° bend.

Furthermore, the invention may also be used in all traditional and local preforming methods such as those described in document 3: EP-A-653 504, thereby offering the possibility of changing the shape of the item being drawn in a controlled and continuous manner.

Finally, the use of this die, whatever the material being drawn, permits true control of the method based on the geometric specifications of the item being produced.

Fine thermal control enables one to always remain within the hypothetical conditions where the height of the meniscus is very small compared with the diameter of the die Ef and hence to make possible the use of equations R1 and R3 given above that relate to the drawing angle $\alpha$ and the thickness Ec of the drawn crystal.

Figure 5:
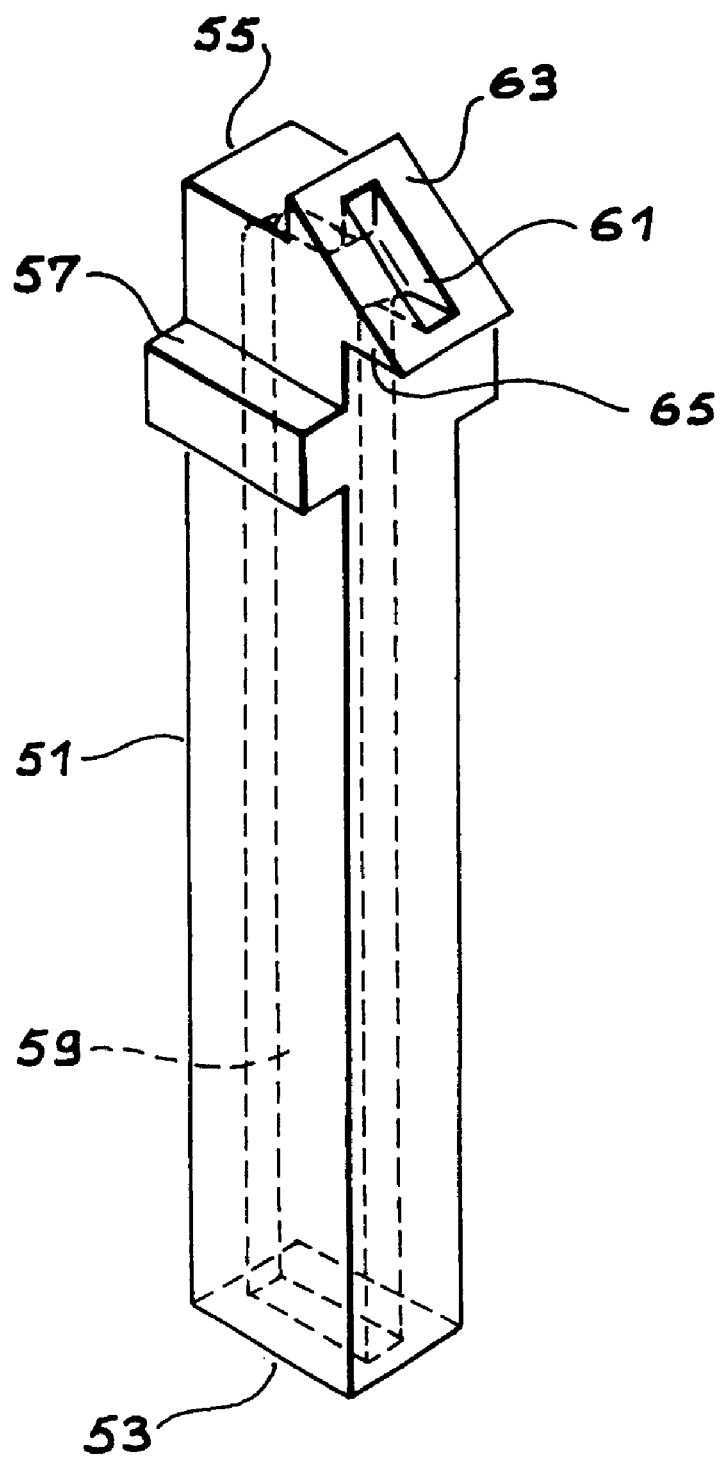
FIG. 5 is a perspective view of a die conforming to the invention.

In FIG. 5, a die is shown that conforms to a preferred embodiment of the invention. This die comprises a body 51, a lower face 53, an upper face 55 and a shoulder 57 used as a support in the drawing installation. This die is bored with a capillary channel 59 of rectangular section, which emerges at one end, at the lower face 53 and at the other end at the upper face 55 through the opening 61 that is also of rectangular section.

This upper face is so conformed that it presents an inclined flat surface 63 that makes an angle $\theta$ less than 90°, for example 45°, with the longitudinal axis of the capillary channel 59, the remainder of the upper face 55 making an angle of approximately 90° with the longitudinal axis of the capillary channel. At the surface 63, the capillary channel 59 emerges into the opening 61 through an inclined section 65 of smaller section the edges of which broaden out since they make an angle less than 90°, for example 45°, with the surface 63.

This die is particularly suitable for the preforming of sapphire ($Al_2O_3$). Its shape and that of the base which supports it have been especially researched in order to optimize the thermal profile on the inclined surface 63. The meniscus which is formed on this surface thereby preserves excellent contact limit conditions throughout the growth.

This die is preferably produced in molybdenum.

Figure 6A:
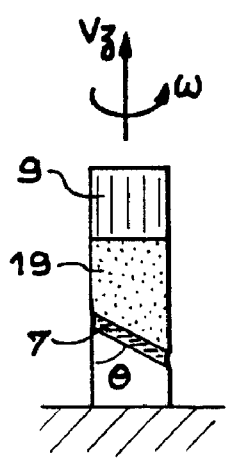
FIGS. 6A, 6B, 6C illustrate the production of a hemispherical crown using a die conforming to the invention.
Figure 6B:
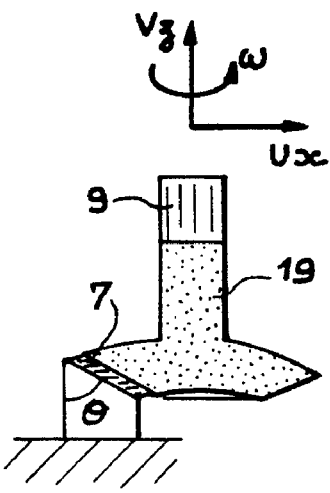
Figure 6C:
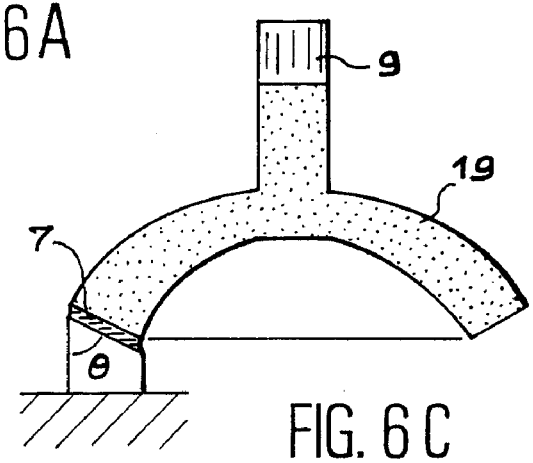

In FIGS. 6A to 6C, the production of a hemi-spherical crown is shown using the die of the invention having an angle $\theta$ of 45°. In these figures, the same reference numbers have been used as in FIG. 2.

In this case, the local preforming method is used, this method consisting of varying the drawing angle $\alpha$ in a continuous fashion, through the combination of a vertical drawing movement at speed Vz, a horizontal translational movement at speed Ux and a rotational movement of the seed 9 at speed $\omega$.

At the beginning, FIG. 6A, a vertical section is produced by vertical drawing and simultaneous rotation of the seed 9. Next, the hemi-spherical part is formed by varying the growth parameters (Vz, Ux and $\omega$) in order to generate the sphere. In FIG. 6B, the drawing takes place practically horizontally, then the drawing angle changes and reduces (FIG. 6C) as the hemi-spherical crown is formed.

Figure 7A:
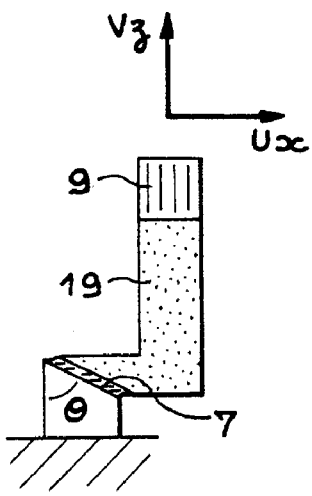
FIGS. 7A, 7B, 7C illustrate the production of an elbow-shaped item with a die conforming to the invention.
Figure 7B:
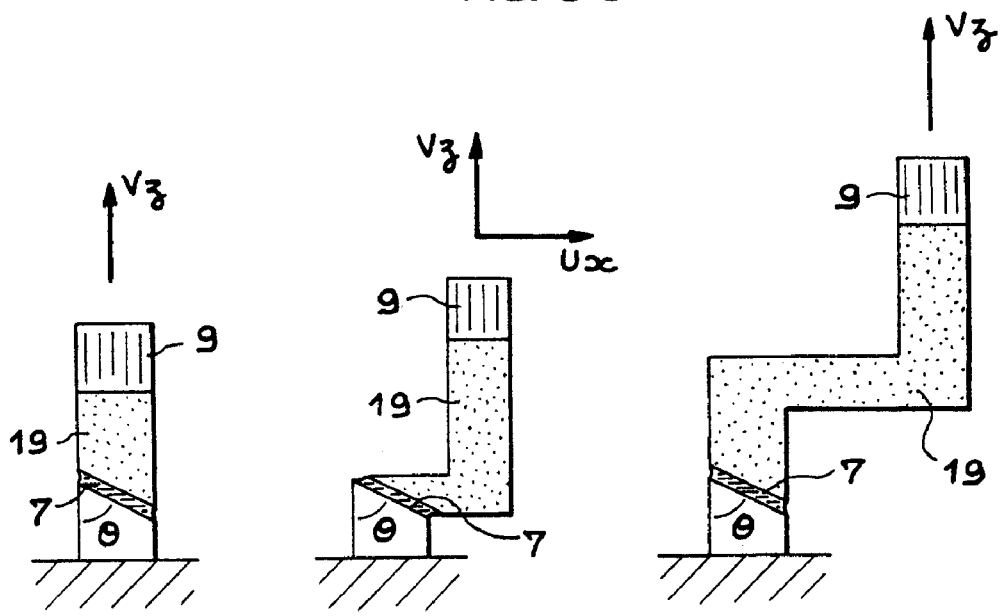
Figure 7C:
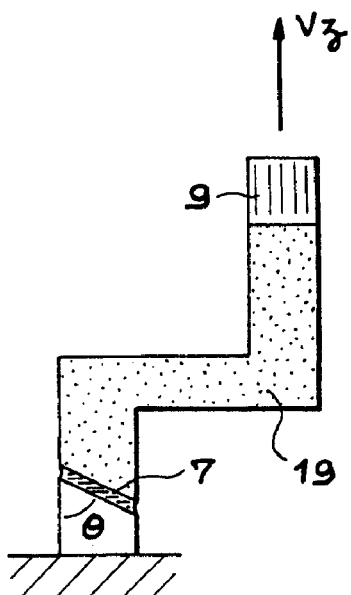

In FIGS. 7A to 7C, the same reference numbers have been used and the production of an elbow piece has been shown using traditional preforming, without rotation of the seed, with the die of the invention.

At the start (FIG. 7A), a vertical section is produced by simple drawing with a single movement of the seed in the vertical direction at speed Vz.

Next the elbow part is formed (FIG. 7B) by simultaneously subjecting the seed to a horizontal and a vertical movement at speeds Ux and Vz.

After producing the elbow part, growth is continued (FIG. 7C) only using the vertical movement Vz as in FIG. 7A.

Of course, one may combine the methods described relating to FIGS. 6A, 6B, 6C, 7A, 7B and 7C to form a hemispherical crown and finish it with a bar bent at right angles by stopping the rotational movement of the seed.

Therefore, the invention offers numerous advantages since it permits the production of complex shapes with materials that are difficult to machine, such as, for example, sapphire which has optical, thermal, mechanical and chemical properties that are very interesting.

The fields of application for this material extend from jewelry (watch glasses), to the production of ultra-strong technological components (nozzles and high pressure windows, cutting tools), and to military devices for infra-red transmission (IR domes). Bearing in mind the exceptional hardness of sapphire, preforming substantially reduces its production costs.

The device for growth by inclination of the solidification interface extends preforming to the production of components that until now have been impossible to produce with traditional dies. The hemispherical crown, cladding with particular shapes (for example, hollow elbow tubes), and the special crucibles are applications that may be developed through this method.

Other materials, even those that are much more machinable than sapphire may also be used with this method, since certain shapes obtained by preforming are totally impossible to produce by machining (typically hollow items and items bent at right angles).

References quoted
1. La Belle Jr., J. of Crystal Growth, 50, 1980, p. 8–17,
2. Tatarchenko, Shaped Crystal Growth, Kluwer Academic Publishers, 1993, p. 1∫18,
3. EP-A-653 504
4. U.S. Pat. No. 4,430,305

What is claimed is:

1. Die for drawing mono-crystals or poly-crystals from a molten bath, comprising a body bored with at least one longitudinal capillary channel arranged between a lower face of the body intended to be immersed in the molten bath and an upper face of the body intended to support liquid coming from the molten bath through the capillary channel or channels, wherein said upper face comprises a planar flat surface onto which the capillary channel or channels emerge, said flat surface forming an angle θ less than 90° with the longitudinal axis of the capillary channel or channels.

2. Die according to claim 1, comprising a single capillary channel of circular, square or rectangular section.

3. Die according to claim 1, comprising a single capillary channel, the cross section of which is a circular crown.

4. Die according to claim 1, comprising several capillary channels that emerge below the upper face into a single capillary channel of rectangular section.

5. Die according to claim 1, characterized in that the angle θ is equal to 45°.

6. Die according to claim 1, wherein edges of the opening of the capillary channel on the flat surface of the upper face of the die form an angle less than 90° with this flat surface.

7. Die according to claim 1, comprising a single capillary channel and an upper face, only one part of which forms the flat surface making an angle θ less than 90° with the longitudinal axis of the capillary channel, the capillary channel emerging onto this flat surface through a section inclined with respect to the longitudinal axis of the channel.

8. Die according to claim 7, wherein the section has a cross section smaller than that of the rest of the capillary channel.

9. Die according to claim 8 wherein edges of the opening through which the section emerges onto the flat surface of the upper face of the die form an angle less than 90° with this flat surface.

10. Die according to claim 1, wherein edges of the opening of the capillary channel make an angle of 45° with the flat surfaces of the upper face of the die.

11. Die according to claim 1, produced in molybdenum.

12. Method of manufacturing an item made of a poly-crystalline or monocrystalline material, wherein the item is formed from a bath of molten material by drawing molten material through a die bored with at least one capillary channel and crystallizing the molten material coming out of the capillary channel in contact with a seed, the seed and/or the die being subjected to at least one translational movement and/or rotational movement in a plane perpendicular to the direction of drawing, wherein a crystallization interface of the molten material forms an angle θ less than 90° with the direction of drawing.

* * * * *